(12) United States Patent
Jang et al.

(10) Patent No.: US 9,252,388 B2
(45) Date of Patent: Feb. 2, 2016

(54) ORGANIC LIGHT EMITTING DIODE (OLED) DISPLAY

(71) Applicant: Samsung Display Co., Ltd., Yongin, Gyeonggi-do (KR)

(72) Inventors: Cheol Jang, Yongin (KR); Seung-Hun Kim, Yongin (KR); Seung-Yong Song, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 268 days.

(21) Appl. No.: 13/801,973

(22) Filed: Mar. 13, 2013

(65) Prior Publication Data

US 2014/0132148 A1    May 15, 2014

(30) Foreign Application Priority Data

Nov. 14, 2012   (KR) .................. 10-2012-0129101

(51) Int. Cl.
*H01L 51/50* (2006.01)
*H01L 51/52* (2006.01)

(52) U.S. Cl.
CPC ........ *H01L 51/5246* (2013.01); *H01L 51/5256* (2013.01)

(58) Field of Classification Search
None
See application file for complete search history.

(56) References Cited

U.S. PATENT DOCUMENTS

| | | | |
|---|---|---|---|
| 6,210,815 B1 * | 4/2001 | Ooishi | ........................ 428/690 |
| 8,030,841 B2 | 10/2011 | Kwack et al. | |
| 2002/0140347 A1 * | 10/2002 | Weaver | ........................ 313/506 |
| 2002/0163614 A1 * | 11/2002 | Hinata et al. | .................. 349/139 |
| 2003/0066311 A1 * | 4/2003 | Li et al. | ............................. 65/43 |
| 2003/0155861 A1 * | 8/2003 | Nishizawa et al. | ........... 313/512 |
| 2003/0164681 A1 * | 9/2003 | Fukuoka et al. | ............. 313/512 |
| 2005/0040762 A1 * | 2/2005 | Kurihara | ...................... 313/512 |
| 2005/0116636 A1 * | 6/2005 | Kang | ............................ 313/512 |
| 2005/0140290 A1 * | 6/2005 | Park et al. | ..................... 313/512 |
| 2005/0224935 A1 * | 10/2005 | Schaepkens et al. | ......... 257/678 |
| 2005/0269940 A1 * | 12/2005 | Nishikawa et al. | ........... 313/500 |

(Continued)

FOREIGN PATENT DOCUMENTS

| | | |
|---|---|---|
| JP | 2000-268955 A | 9/2000 |
| JP | 2005-216635 A | 8/2005 |

(Continued)

OTHER PUBLICATIONS

Korean Notice of Allowance dated May 16, 2014 for Korean Patent Application No. KR 10-2012-0129101 which corresponds to captioned U.S. Appl. No. 13/801,973.

(Continued)

*Primary Examiner* — Britt D Hanley
(74) *Attorney, Agent, or Firm* — Knobbe, Martens, Olson & Bear, LLP

(57) ABSTRACT

An organic light emitting diode (OLED) display is disclosed. In one aspect, the display includes a substrate having a light emission area and a non-emission area outside the light emission area, an organic light emitting unit formed on the light emission area and a blocking unit that is disposed on the non-emission area to surround the organic light emitting unit. The OLED display further includes a coating unit formed to coat an external surface of the blocking unit and an encapsulation unit formed by alternately stacking at least one first thin film and at least one second thin film on an area surrounded by the blocking unit so as to encapsulate the organic light emitting unit.

23 Claims, 3 Drawing Sheets

(56) References Cited

U.S. PATENT DOCUMENTS

| | | | |
|---|---|---|---|
| 2006/0192915 A1* | 8/2006 | Kimura | 349/151 |
| 2007/0096631 A1* | 5/2007 | Sung et al. | 313/498 |
| 2007/0159096 A1* | 7/2007 | Oh et al. | 313/512 |
| 2007/0170605 A1* | 7/2007 | Lee et al. | 264/1.1 |
| 2007/0170845 A1* | 7/2007 | Choi et al. | 313/504 |
| 2007/0232182 A1* | 10/2007 | Park | 445/25 |
| 2007/0279571 A1* | 12/2007 | Koo et al. | 349/153 |
| 2008/0001533 A1* | 1/2008 | Kim et al. | 313/504 |
| 2009/0236981 A1* | 9/2009 | Chang et al. | 313/504 |
| 2010/0200846 A1 | 8/2010 | Kwack et al. | |
| 2010/0244057 A1* | 9/2010 | Ryu et al. | 257/88 |
| 2011/0140599 A1* | 6/2011 | Lee et al. | 313/512 |
| 2011/0198620 A1* | 8/2011 | Han et al. | 257/88 |
| 2011/0205198 A1 | 8/2011 | Jeong et al. | |
| 2011/0210344 A1* | 9/2011 | Han et al. | 257/88 |
| 2011/0212304 A1* | 9/2011 | Han et al. | 428/172 |
| 2011/0291116 A1* | 12/2011 | Kang et al. | 257/88 |

FOREIGN PATENT DOCUMENTS

| | | |
|---|---|---|
| JP | 2010-097192 A | 4/2010 |
| KR | 10-2002-0080067 A | 10/2002 |
| KR | 10-2004-0070976 A | 8/2004 |
| KR | 10-2009-0112387 A | 10/2009 |
| KR | 10-2010-0090888 A | 8/2010 |
| KR | 10-2011-0097046 A | 8/2011 |
| KR | 10-2011-0130925 A | 12/2011 |
| KR | 10-1182234 B1 | 9/2012 |

OTHER PUBLICATIONS

Korean Office Action dated Dec. 9, 2013 for Korean Patent Application No. KR 10-2012-0129101 which corresponds to captioned U.S. Appl. No. 13/801,973.

* cited by examiner

ORGANIC LIGHT EMITTING DIODE (OLED) DISPLAY

CROSS-REFERENCE TO RELATED PATENT APPLICATION

This application claims the benefit of Korean Patent Application No. 10-2012-0129101, filed on Nov. 14, 2012, in the Korean Intellectual Property Office, the disclosure of which is incorporated herein in its entirety by reference.

BACKGROUND

1. Field

The described technology generally relates to an organic light emitting diode (OLED) display.

2. Description of the Related Technology

OLED displays generally have a faster response speed and an enhanced image quality over liquid crystal displays (LCDs), which are currently widely commercialized. Also, OLED displays are self-emissive and thus have a wide angle of view, and have high luminance, and thus are noticed as next-generation displays.

An OLED display generally includes a pixel electrode and an opposite electrode facing each other and an emissive layer including an organic material interposed between the pixel electrode and the opposite electrode.

SUMMARY

One inventive aspect is an organic light emitting diode (OLED) display in which penetration of water or a gas such as oxygen from the outside may be prevented.

Another aspect is an organic light emitting diode (OLED) display comprising: a substrate having a light emission area and a non-emission area outside the light emission area; an organic light emitting unit formed on the light emission area; a blocking unit that is disposed on the non-emission area to surround the organic light emitting unit; a coating unit formed to coat an external surface of the blocking unit; and an encapsulation unit formed by alternately stacking at least one first thin film and at least one second thin film on an area surrounded by the blocking unit so as to encapsulate the organic light emitting unit.

The encapsulation unit may be formed by alternately stacking the at least one first thin film and the at least one second thin film in a direction away from the organic light emitting unit.

The at least one first thin film may be formed of an inorganic material.

The at least one first thin film may be a single layer formed of one of aluminum oxide (AlOx), silicon nitride (SiNx), silicon oxide (SiOx), and magnesium oxide (MgO).

The at least one first thin film may have a multi-layer nanolaminate structure in which a plurality of single layers formed of different materials are included.

The at least one second thin film may be formed of an organic material.

The blocking unit may have a height that is identical to or greater than a height of the encapsulation unit.

The blocking unit may be formed of an organic material.

The coating unit may be formed of an inorganic material.

The blocking unit may comprise a first blocking member that is disposed on the non-emission area to surround the organic light emitting unit and a second blocking member that is disposed on and further toward an outer portion of the non-emission area than the first blocking member to surround the first blocking member.

The first blocking member and the second blocking member may be separated from each other, and an intermediate member may be further disposed between the first blocking member and the second blocking member.

The coating unit may coat surfaces of the first blocking member, the second blocking member, and the intermediate member.

The first blocking member, the second blocking member, and the intermediate member may be formed of an organic material.

The blocking unit may comprise a first blocking member that is disposed on the non-emission area to surround the organic light emitting unit, a second blocking member that is disposed on and further toward an outer portion of the non-emission area than the first blocking member to surround the first blocking member, and a third blocking member that is disposed on and further toward the outer portion of the non-emission area than the second blocking member to surround the second blocking member.

The second blocking member may have a height that is greater than a height of the first blocking member and smaller than a height of the third blocking member.

The encapsulation unit may have a plurality of second thin films, and the height of the first blocking member is the same as or greater than a height of a first second thin film that is disposed at a lowermost end among the plurality of second thin films.

The encapsulation unit may have a plurality of second thin films, and the height of the second blocking member may be the same as or greater than a height of a thin film that is disposed at a second lowermost end among the plurality of second thin films.

The encapsulation unit may have more than three second thin films, and the height of the third blocking member is the same as or greater than a height of a third second thin film that is disposed at a third lowermost end among the plurality of second thin films.

The first blocking member, the second blocking member, and the third blocking member may be separated from one another.

The encapsulation unit may have a plurality of second thin films, and a first second thin film may be disposed at a lowermost end among the plurality of second thin films is disposed between the organic light emitting unit and the first blocking member.

The encapsulation unit may have a plurality of second thin films, and a thin film may be disposed at a second lowermost end among the plurality of second thin films is disposed between the first blocking member and the second blocking member.

The encapsulation unit may have more than three second thin films, and a third second thin film may be disposed at a third lowermost end among the plurality of second thin films is disposed between the second blocking member and the third blocking member.

The organic light emitting display apparatus may further comprise: a moisture absorbent covering upper portions of the encapsulation unit and the coating unit; and a film covering the moisture absorbent.

DETAILED DESCRIPTION

Generally, an OLED display is highly sensitive to water, oxygen, light or the like. When in contact with a liquid such as water, a gas such as oxygen, or when exposed to light, the display may easily deteriorate. Furthermore, if oxygen or water diffuses into an organic material layer, an electrochemical charge motion occurs on an interface between an electrode and the organic material layer to create an oxide. The oxide separates the organic material layer from the pixel electrode or the opposite electrode, causing a phenomenon such as dark spots. As a result, the lifespan of the OLED display decreases. The OLED display has low durability to heat, and thus when a temperature increases from about 30° to about 60°, the lifespan of the OLED display is known to decrease by about 20 times. Accordingly, an encapsulation method is typically used in order to prevent penetration of water, oxygen, light and the like from the outside into the OLED display.

Embodiments will now be described more fully with reference to the accompanying drawings. Expressions such as "at least one of," when preceding a list of elements, modify the entire list of elements and do not modify the individual elements of the list.

Figure 1:
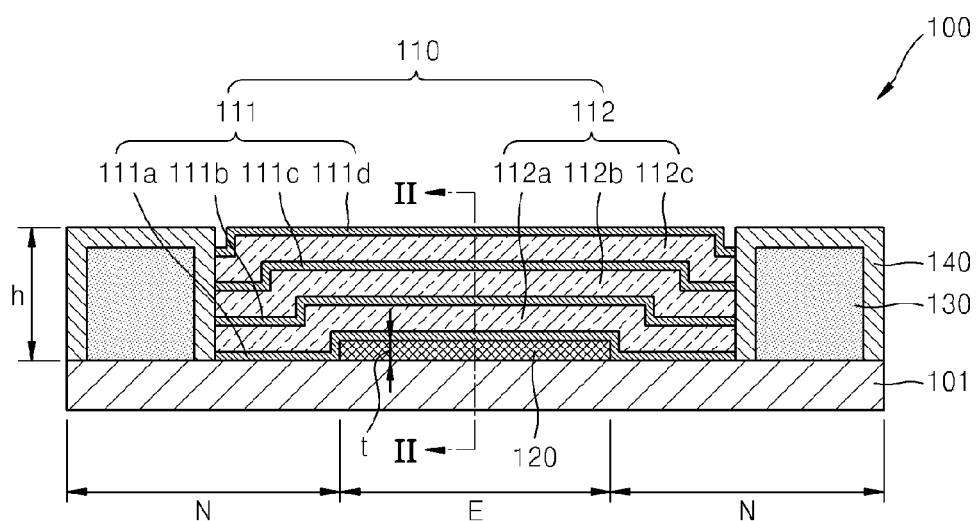
FIG. 1 is a schematic cross-sectional view of an organic light emitting diode (OLED) display apparatus according to an embodiment.
Figure 2:
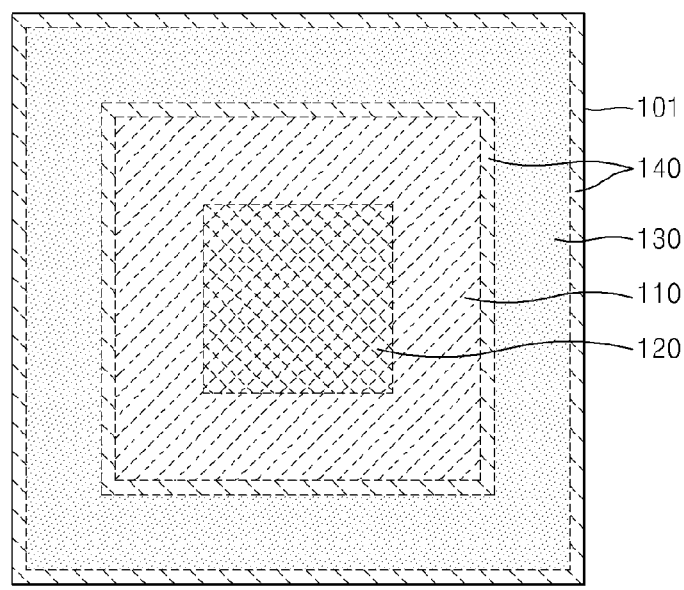
FIG. 2 is a schematic plan view of the OLED display of FIG. 1 according to an embodiment.

FIG. 1 is a schematic cross-sectional view of an OLED display 100 according to an embodiment. FIG. 2 is a schematic plan view of the OLED display 100 of FIG. 1 according to an embodiment.

Referring to FIGS. 1 and 2, the OLED display 100 may include a substrate 101, an organic light emitting unit 120, an encapsulation unit 110, a blocking unit 130, and a coating unit 140.

The substrate 101 has a light emission area E and a non-emission area N. The light emission area E may be disposed in a central portion of the substrate 101, and the non-emission area N may be disposed in an outer portion of the substrate 101 to surround the light emission area E. The organic light emitting unit 120 may be formed on the light emission area E, and a portion of the encapsulation unit 110 and the blocking unit 130 may be formed on the non-emission area N.

The substrate 101 may be formed of a transparent glass material having silicon dioxide ($SiO_2$) as a main component. However, the substrate 101 is not limited thereto and may also be formed of various materials such as a transparent plastic material or a metal. A buffer layer 51 (see FIG. 3) may be further formed on the substrate 101 depending on the embodiment.

The organic light emitting unit 120 may include a plurality of OLEDs and a thin film transistor TFT. The OLEDs of the organic light emitting unit 120 each include a pixel electrode, an opposite electrode facing the pixel electrode, and an intermediate layer including an emissive layer and interposed between the pixel electrode and the opposite electrode. This will be described later in detail.

The blocking unit 130 may be formed on the non-emission area N of the substrate 101 to surround the organic light emitting unit 120. In one embodiment, the blocking unit 130 is separated by a distance from a side of the organic light emitting unit 120 to surround side portions of the organic light emitting unit 120. The blocking unit 130 may be formed of a photosensitive material such as polyimide (PI). The blocking unit 130 may also be formed during the same manufacturing operation as a pixel defining layer 60 (see FIG. 3) and of the same material as the pixel defining layer 60. In one embodiment, the blocking unit 130 is formed to have a height h that is greater than a thickness t of the organic light emitting unit 120. In space surrounded by the blocking unit 130, the encapsulation unit 110 may be formed to cover the organic light emitting unit 120. The encapsulation unit 110 will be described in detail later.

An external surface of the blocking unit 130 is coated with a coating unit 140. The blocking unit 130 may be formed of an organic material, and the coating unit 140 may be formed of an inorganic material such as an oxide metal, a nitride metal, an oxynitride metal, and a metal carbide. Also, the coating unit 140 may be formed substantially at the same time when forming a first thin film 111 of the encapsulation unit 110 which will be described later.

The encapsulation unit 110 encapsulates the organic light emitting unit 120 in the space formed by the blocking unit 130. The encapsulation unit 110 may be formed by alternately stacking first thin films 111 and second thin films 112. The first thin films 111 may include thin films 111a, 111b, 111c and 111d. The second thin films 112 may include thin films 112a, 112b, and 112c. That is, a thin film 111a is formed to directly encapsulate the organic light emitting unit 120, and a thin film 112a is formed on the thin film 111a. Also, a thin film 111b is formed on the thin film 112a, and a thin film 112b is formed on the thin film 111b. Furthermore, a thin film 111c is formed on the thin film 112b and a thin film 112c is formed on the thin film 111c. A thin film 111d may be formed on the thin film 112c. While the encapsulation unit 110 is formed of the first thin films 111a, 111b, 111c, and 111d and the second thin films 112a, 112b, and 112c, the embodiments are not limited thereto. The encapsulation unit 110 may be formed of at least one of the first thin films 111 and at least one of the second thin films 112. Also, when the encapsulation unit 110 is formed by alternately stacking a plurality of first thin films 111 and a plurality of second thin films 112, the uppermost portion of the encapsulation unit 110 may be formed by a first thin film 111. This is because the thin film 111a covers the organic light emitting unit 120 directly and then the second thin films 112 and the first thin films 111 are alternately stacked.

The encapsulation unit 110 is formed to cover an upper portion and a side portion of the organic light emitting unit 120 to substantially completely encapsulate the organic light emitting unit 120 as described above. Also, the encapsulation unit 110 is formed such that a side portion thereof is adhered to the coating unit 140. That is, the first thin films 111a, 111b, 111c, and 111d and the second thin films, 112a, 112b, and 112c substantially completely cover the organic light emitting unit 120 and ends thereof and all contact the blocking unit 130 so as to substantially fill the space formed by the blocking unit 130.

Each of the first thin films 111a, 111b, 111c, and 111d may be formed by using various typical thin film forming methods such as a sputtering method, a chemical vapor deposition (CVD) method, or a plasma enhanced chemical vapor deposition (PECVD).

When forming the first thin films 111a, 111b, 111c, and 111d by using the above-described methods, a shadow mask of substantially the same size may be used. That is, one sheet of shadow mask may be used to form the first thin films 111a, 111b, 111c, and 111d. Accordingly, the sizes, or surface areas, of the first thin films 111a, 111b, 111c, and 111d may be substantially the same. As one sheet of shadow mask is used to form the first thin films 111a, 111b, 111c, and 111d, the manufacturing costs may be reduced. In addition, as the first thin films 111a, 111b, 111c, and 111d are stacked by using one sheet of shadow mask, alignment tolerance of each of the first thin films 111a, 111b, 111c, and 111d may be reduced.

The first thin films 111 may be formed of an inorganic material. For example, the thin films 111a, 111b, 111c, and 111d may each be formed of a single layer formed of one of Aluminum oxide (AlOx), Silicon nitride (SiNx), Silicon oxide (SiOx), and Magnesium oxide (MgO). Also, the first films 111a, 111b, 111c, and 111d may each have a multi-layer nanolaminate structure in which single layers are formed of different layers. The nanolaminate structure refers to a structure in which thin films having different thicknesses measured in nanometers are alternately deposited. For example, if the f thin film 111a has a nanolaminate structure, the thin film 111a may have a structure in which an AlOx layer and a SiNx layer are alternately deposited.

The first thin films 111 formed of an inorganic material may function to block water or a gas such as oxygen. As described above, the penetration of water or a gas such as oxygen from the outside may be prevented by substantially completely encapsulating the organic light emitting unit 120, thereby protecting the organic light emitting unit 120.

The second thin films 112a, 112b, and 112c may be formed by using typical thin film forming methods similar to those used in forming the first thin films 111a, 111b, 111c, and 111d. For example, methods such as a sputtering method, a CVD method, or a plasma CVD method may be used.

The second thin films 112a, 112b, and 112c may be formed using the above-described methods by using one sheet of shadow mask. Accordingly, the second thin films 112a, 112b, and 112c may be substantially the same sizes. As described above, as the second thin films 112a, 112b, and 112c are formed by using one sheet of shadow mask, the manufacturing costs of the OLED display 100 may be reduced.

The second thin films 112 may be formed of an organic material. For example, the second thin films 112 may be formed of an acrylic resin. The second thin films 112a, 112b, and 112c function to planarize surfaces of the first thin films 111a, 111b, and 111c disposed therebelow.

In one embodiment, the second thin films 112 formed of an organic material do not directly contact the substrate 101. Instead, the second thin films 112 may contact the first thin films 111 formed of an inorganic material and the coating unit 140, thereby effectively preventing penetration of water or a gas such as oxygen. In one embodiment, when forming the second thin films 112, which are formed of an organic material, a surface condition thereof may be important. If an inorganic material layer is formed to cover the organic light emitting unit 120, and if an organic material layer is formed to cover the inorganic material layer, a portion of the organic material layer is formed on the substrate 101, and a portion of the organic material layer is formed on the inorganic material layer. As the portion of the organic material layer formed on the substrate 101 and the portion of the organic material layer formed on the inorganic material layer become to have different surface conditions, fine gaps may be formed between the organic material layer and the substrate 101 or between the organic material layer and the inorganic material layer, and thus damage to the organic light emitting unit 120 due to penetration of water or gas from the outside may be caused.

However, as the second thin films 112 are formed to be surrounded by the first thin films 111 and by the coating unit 140 according to the current embodiment, all of the second thin films 112 may have substantially uniform characteristics.

Also, the OLED display 100 according to the current embodiment may prevent penetration of water or a gas such as oxygen through not only an upper portion of the organic light emitting unit 120 but also through lateral sides of the organic light emitting unit 120. That is, as the first thin films 111 and the second thin films 112 are alternately stacked on the organic light emitting unit 120, penetration of water or a gas such as oxygen through the upper portion of the organic light emitting unit 120 may be prevented. In addition, as the blocking unit 130 is formed at a side portion of the organic light emitting unit 120 so as to surround the encapsulation unit 110, and as the coating unit 140 formed of an inorganic material is coated on an external surface of the blocking unit 130, water or a gas such as oxygen penetrating through lateral sides of the OLED display 100 may be prevented.

Figure 3:
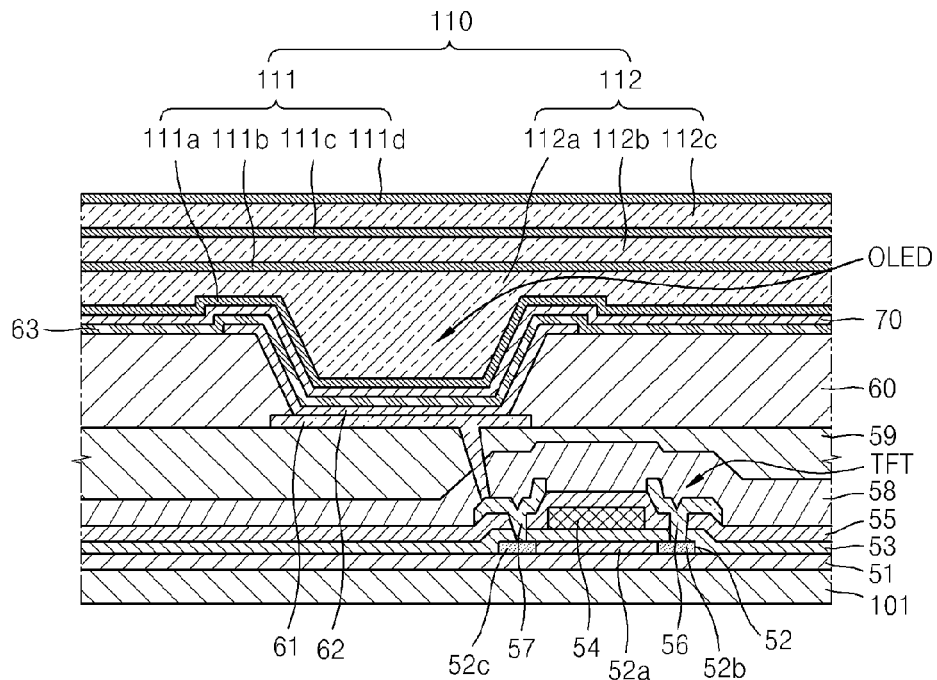
FIG. 3 is a cross-sectional view of the OLED display of FIG. 1 cut along a line II-II according to an embodiment.

FIG. 3 is a cross-sectional view of the OLED display 100 of FIG. 1 cut along a line II-II according to an embodiment.

Referring to FIG. 3, the organic light emitting unit having an active matrix type is formed on the substrate 101, and the organic light emitting unit may include an OLED and a thin film transistor (TFT). However, the embodiments are not limited thereto, and the organic light emitting unit 120 may also be a passive matrix type.

The substrate 101 may be formed of a transparent material such as a glass material, a plastic material, or a metal as described above. An insulating layer 51 such as a buffer layer may be formed overall on the substrate 101.

A TFT and an OLED as illustrated in FIG. 3 are formed on the insulating layer 51.

A semiconductor active layer 52 that is arranged in a predetermined pattern is formed on an upper surface of the insulating layer 51. The semiconductor active layer 52 is covered by a gate insulating layer 53. The active layer 52 may be formed of a p-type or n-type semiconductor.

A gate electrode 54 of a TFT is formed on an upper surface of the gate insulating layer 53 in a position corresponding to the active layer 52. Also, an interlayer insulating layer 55 is formed to cover the gate electrode 54. After the interlayer insulating layer 55 is formed, the gate insulating layer 53 and the interlayer insulating layer 55 may be etched using an etching operation such as a dry etching method to thereby form contact holes and expose a portion of the active layer 52.

Next, source/drain electrodes 56 and 57 are formed on the interlayer insulating layer 55 so as to contact the active layer 52 that is exposed via a contact hole. A protection layer 58 is formed to cover the source/drain electrodes 56 and 57, and a portion of the drain electrode 57 is exposed by using an etching operation. An additional insulating layer 59 may be further formed on the protection layer 58 in order to planarize the protection layer 58.

Then, a first electrode 61 is formed on the protection layer 58. The first electrode 61 is electrically connected to the drain electrode 57 of the TFT.

Also, a pixel defining layer 60 is formed to cover the first electrode 61. A predetermined opening portion is formed in the pixel defining layer 60, and an organic layer 62 including an emissive layer is formed in an area limited to this opening portion. A second electrode 63 is formed on the organic layer 62.

The pixel defining layer 60 partitions each pixel and is formed of an organic material to planarize a surface of the substrate 101 on which the first electrode 61 is formed, particularly, a surface of the insulating layer 59.

The first electrode 61 and the second electrode 63 are insulated from each other, and voltages of different polarities are applied to the organic layer 62 including the emissive layer so as to allow light emission.

The organic layer 62 including the emissive layer may be formed of a low molecular organic material or a polymer organic material. When formed of a low molecular weight non-polymeric organic material, the organic layer 62 may include a hole injection layer (HIL), a hole transport layer (HTL), an emission layer (EML), an electron transport layer (ETL), an electron injection layer (EIL) or the like, which are stacked in a single structure or a complex structure. Examples of organic materials that may be used are various as copper phthalocyanine (CuPc), N,N'-Di(naphthalene-1-yl)-N,N'-diphenyl-benzidine (NPB), tris-8-hydroxyquinoline aluminum (Alq3).

After forming the organic layer 62, the second electrode 63 may be formed by using the same deposition method.

Meanwhile, the first electrode 61 may function as an anode electrode, and the second electrode 63 may function as a cathode electrode, and polarities of the first electrode 61 and the second electrode 63 may be exchanged. Also, the first electrode 61 may be patterned so as to correspond to each area of each pixel, and the second electrode 63 may be formed to cover all pixels.

The first electrode 61 may be formed of a transparent electrode or a reflective electrode; when the first electrode 61 is used as a transparent electrode, it may be formed of ITO, IZO, ZnO, or $In_2O_3$, and when the first electrode 61 is used as a reflective electrode, it may be formed by forming a reflective layer using Ag, Mg, Al, Pt, Pd, Au, Ni, Nd, Ir, Cr, or a compound of these and then forming a transparent electrode thereon of ITO, IZO, ZnO, or $In_2O_3$. The first electrode 61 is formed, for example, by using a sputtering method, and then patterned using a photo-lithography method.

Meanwhile, the second electrode 63 may also be formed of a transparent electrode or a reflective electrode. When the second electrode 63 is formed of a transparent electrode, it is used as a cathode electrode, and thus, first, a metal having a small work function, such as Li, Ca, LiF/Ca, LiF/Al, Al, Ag, Mg, and a compound thereof is deposited to be in a direction of the organic layer 62 including an emissive layer, and then an auxiliary electrode layer or a bus electrode line may be formed of ITO, IZO, ZnO, or $In_2O_3$ thereon. Also, when the second electrode 63 is used as a reflective electrode, Li, Ca, LiF/Ca, LiF/Al, Al, Ag, Mg, and a compound thereof are deposited on the entire surface of the organic layer 62. Here, deposition may be performed in the same manner as in the case of the organic layer 62 including the above-described emissive layer.

Figure 4:
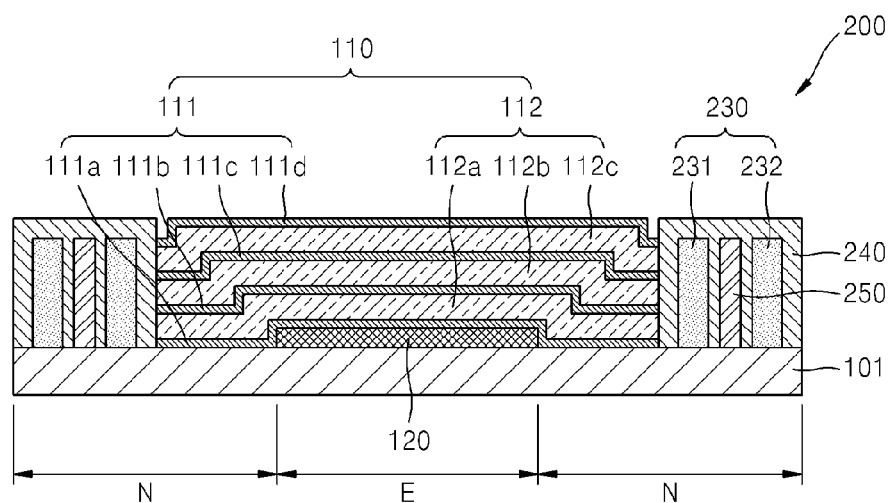
FIG. 4 is a schematic cross-sectional view of an OLED display according to another embodiment.

FIG. 4 is a schematic cross-sectional view of an OLED display 200 according to another embodiment.

Referring to FIG. 4, the OLED display 200 is different from the OLED display 100 of FIG. 1 in terms of a blocking unit 230 and an intermediate member 250. That is, a substrate 101, an organic light emitting unit 120, a plurality of first thin films 111, and a plurality of second thin films 112 of the OLED display 200 are substantially the same as or similar to those of the OLED display 100 described above. Thus, description of common elements will be omitted but the blocking unit 230 and the intermediate member 250 will be described.

The blocking unit 230 may be formed of a first blocking member 231 and a second blocking member 232. The first blocking member 231 may be disposed on a non-emission area N of the substrate 101 to surround the organic light emitting unit 120. Also, the second blocking member 232 is disposed on the non-emission area N of the substrate 101 but may be formed further toward an outer portion than the first blocking member 231 to surround the first blocking member 231.

The first blocking member 231 and the second blocking member 232 may be separated from each other, and the intermediate member 250 may be disposed between the first blocking member 231 and the second blocking member 232. The intermediate member 250 may be formed of an acrylic member. The first blocking member 231, the second blocking member 232, and the intermediate member 250 may all be formed to have a height greater than a thickness of the organic light emitting unit 120.

The first blocking member 231, the second blocking member 232, and the intermediate member 250 may be separated from one another, and a coating unit 240 may be formed on external surfaces of the first blocking member 231, the second blocking member 232, and the intermediate member 250.

The first blocking member 231, the second blocking member 232, and the intermediate member 250 may be formed of an organic material, and the coating unit 240 may be formed of an inorganic material. In this case, the coating unit 240, the second blocking member 232, the coating unit 240, the intermediate member 250, the coating unit 240, the first blocking member 231, and the coating unit 240 may be sequentially formed in a direction from a lateral side of the OLED display 100 toward the organic light emitting unit 120. Accordingly, a stack structure in which inorganic and organic materials are stacked is also provided at the lateral side of the OLED display 200 as in the upper portion of the organic light emitting unit 120. Accordingly, water or a gas such as oxygen penetrating through the lateral side of the OLED display 200 may be effectively prevented.

Figure 5:
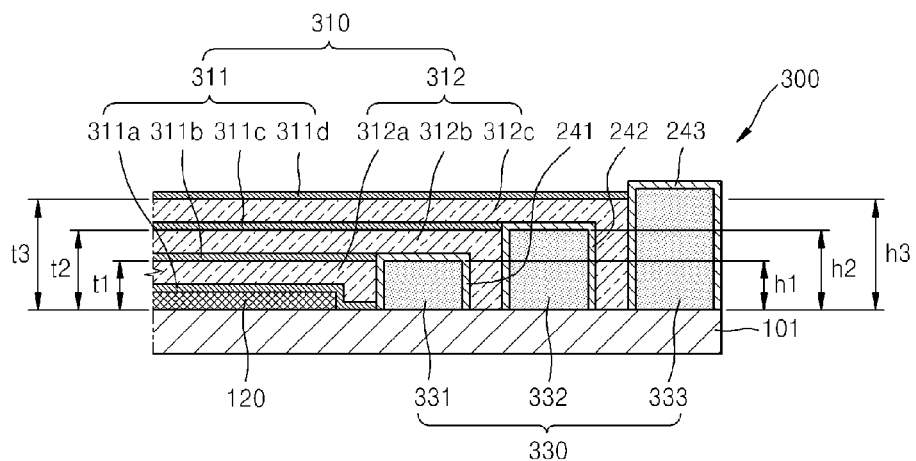
FIG. 5 is a schematic cross-sectional view of an OLED display according to another embodiment.

FIG. 5 is a schematic cross-sectional view of an OLED display 300 according to another embodiment.

Referring to FIG. 5, the OLED display 300 is different from the OLED display 100 of FIG. 1 in terms of a blocking unit 330 and an encapsulation unit 310. That is, a substrate 101 and an organic light emitting unit 120 of the OLED display 300 of FIG. 5 are substantially the same or similar to those of the OLED display 100 described above. Thus, description of common elements will be omitted but the blocking unit 330 and the encapsulation unit 310 will be described.

The blocking unit 330 may be formed of a first blocking member 331, a second blocking member 332, and a third blocking member 333. The first blocking member 331 is disposed on a non-emission area N of the substrate 101 to surround the organic light emitting unit 120. The second blocking member 332 is also disposed on the non-emission area N of the substrate 101, but further toward an outer portion than the first blocking member 331 to surround the first blocking member 331. The third blocking member 333 is also disposed on the non-emission area N of the substrate 101, but more toward an outer portion than the second blocking member 332 to surround the second blocking member 332.

Coating units 241, 242, and 243 may be formed on external surfaces of the first blocking member 331, the second blocking member 332, and the third blocking member 333, respectively.

The first blocking member 331, the second blocking member 332, and the third blocking member 333 may have different heights. For example, as illustrated in FIG. 5, the second blocking member 332 may have a height h2 that is higher than a height h1 of the first blocking member 331 and lower than a height h3 of the third blocking member 333.

The height h1 of the first blocking member 331 may be the same as or greater than a height t1 of a first second thin film 312a which is disposed at the lowermost end on a surface of the substrate 101 from among a plurality of second thin films 312, and the height h2 of the second blocking member 332 may be the same as or greater than a height t2 of a thin film 312b stacked on a first second thin film 312a, and the height h3 of the third blocking member 333 may be the same as or greater than a height t3 of a third second thin film 312c stacked on a thin film 312b.

The first blocking member 331, the second blocking member 332, and the third blocking member 333 may be separated from one another, and the plurality of second thin films 312 may be disposed between the first blocking member 331, the second blocking member 332, and the third blocking member 333.

That is, the first second thin film 312a disposed at the lowermost end among the plurality of second thin films 312 may cover a thin film 311a and fill space between the organic light emitting unit 120 and the first blocking member 331.

Also, the thin film 312b which is disposed at a second lowermost end among the plurality of second thin films 312 may cover a second first thin film 311b and fill space between the first blocking member 331 and the second blocking member 332.

Also, the third second thin film 312c which is disposed at a third lowermost end among the plurality of second thin films 312 may cover a third first thin film 311c and fill space between the second blocking member 332 and the third blocking member 333.

The first blocking member 331, the second blocking member 332, and the third blocking member 333 may be formed of an organic material, and the coating units 241, 242, and 243 may be formed of an inorganic material. In this case, the coating unit 243, the third blocking member 333, the coating unit 243, the second thin film 312c, the coating unit 242, the second blocking member 332, the coating unit 242, the second thin film 312b, the coating unit 241, the second blocking member 331, the coating unit 241, the second thin film 312a, and the third thin film 311a are sequentially formed in a direction from a lateral side of the OLED display 300 toward the organic light emitting unit 120. Accordingly, a stack structure in which inorganic and organic materials are stacked is also provided at a lateral side of the OLED display 300 as in the upper portion of the organic light emitting unit 120. Accordingly, water or a gas such as oxygen penetrating into a lateral side of the OLED display 300 may be effectively prevented.

Figure 6:
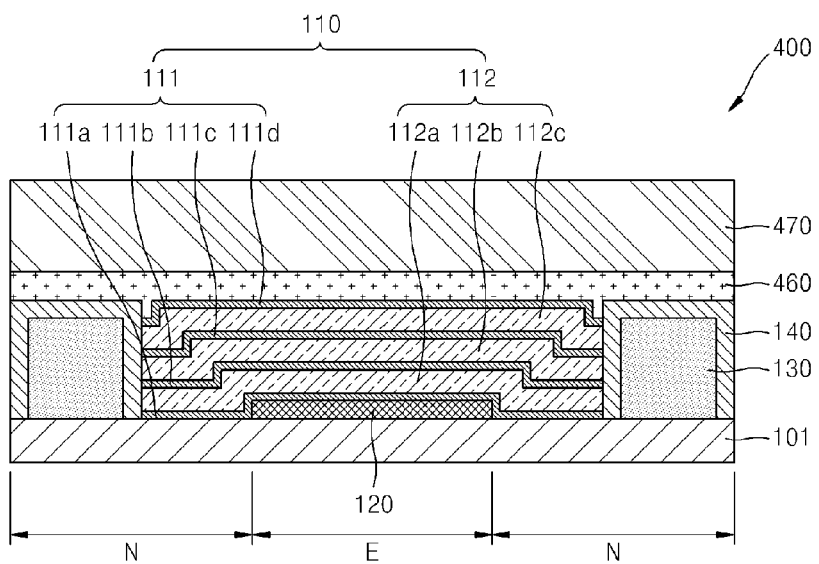
FIG. 6 is a schematic cross-sectional view of an OLED display according to another embodiment.

FIG. 6 is a schematic cross-sectional view of an OLED display 400 according to another embodiment.

Referring to FIG. 6, the OLED display 400 is different from the OLED display 100 of FIG. 1 in that a moisture absorbent 460 and a film 470 are further included therein.

The film 470 is disposed on the organic light emitting unit 120, and may be a polarization film. The moisture absorbent 460 is disposed between the encapsulation unit 110 and the film 470, and may cover both the encapsulation unit 110 and the coating unit 140. The moisture absorbent 460 may absorb water or a gas such as oxygen that may penetrate through an upper portion of the OLED display 400.

According to at least one of the disclosed embodiments, penetration of water or a gas such as oxygen from the outside, particularly, through lateral sides of an OLED display into the OLED display may be prevented.

While the above embodiments have been described with reference to the accompanying drawings, it will be understood by those of ordinary skill in the art that various changes in form and details may be made therein without departing from the spirit and scope of the following claims.

What is claimed is:

1. An organic light emitting diode (OLED) display comprising:
 a substrate comprising a light emission area and a non-emission area surrounding the light emission area;
 an organic light emitting unit formed on the light emission area;
 a blocking unit disposed on the non-emission area to surround the organic light emitting unit;
 a coating unit covering an external surface of the blocking unit; and
 an encapsulation unit encapsulating the organic light emitting unit, wherein encapsulation unit comprises at least one first thin film and at least one second thin film alternatively stacked on each other on an area surrounded by the blocking unit, wherein the encapsulation unit has a bottom surface closest to the substrate, a top surface opposite to the bottom surface, and peripheral side surfaces formed between and connecting the bottom and top surfaces, and wherein the peripheral side surfaces of the encapsulation unit are in direct contact with the coating unit.

2. The OLED display of claim 1, wherein the at least one first thin film and the at least one second thin film are formed over the organic light emitting unit.

3. The OLED display of claim 1, wherein the at least one first thin film, is formed of an inorganic material.

4. The OLED display of claim 1, wherein the at least one first thin film is a single layer formed of one of aluminum oxide (AlOx), silicon nitride (SiNx), silicon oxide (SiOx), and magnesium oxide (MgO).

5. The OLED display of claim 1, wherein the at least one first thin film has a multi-layer nanolaminate structure in which a plurality of single layers formed of different materials are included.

6. The OLED display of claim 1, wherein the at least one second thin film is formed of an organic material.

7. The OLED display of claim 1, wherein the blocking unit has a height that is substantially identical to or greater than the height of the encapsulation unit.

8. The OLED display of claim 1, wherein the blocking unit is formed of an organic material.

9. The OLED display of claim 1, wherein the coating unit is formed of an inorganic material.

10. The OLED display of claim 1, wherein the blocking unit comprises a first blocking member disposed on the non-emission area to surround the organic light emitting unit and a second blocking member disposed on and further toward an outer portion of the non-emission area than the first blocking member.

11. The OLED display of claim 10, wherein the first and second blocking members are separated from each other, and wherein an intermediate member is further disposed between the first and second blocking members.

12. The OLED display of claim 11, wherein the coating unit covers surfaces of the first blocking member, the second blocking member, and the intermediate member.

13. The OLED display of claim 11, wherein the first blocking member, the second blocking member, and the intermediate member are formed of an organic material.

14. The OLED display of claim 1, wherein the blocking unit comprises i) a first blocking member disposed on the non-emission area to surround the organic light emitting unit, ii) a second blocking member disposed on and further toward an outer portion of the non-emission area than the first blocking member, and iii) a third blocking member disposed on and further toward the outer portion of the non-emission area than the second blocking member.

15. An organic light emitting diode (OLED) display comprising:
a substrate comprising a light emission area and a non-emission area surrounding the light emission area;
an organic light emitting unit formed on the light emission area;
a blocking unit disposed on the non-emission area to surround the organic light emitting unit;
a coating unit covering an external surface of the blocking unit; and
an encapsulation unit encapsulating the organic light emitting unit, wherein encapsulation unit comprises at least one first thin film and at least one second thin film alternatively stacked on each other on an area surrounded by the blocking unit,
wherein the blocking unit comprises i) a first blocking member disposed on the non-emission area to surround the organic light emitting unit, ii) a second blocking member disposed on and further toward an outer portion of the non-emission area than the first blocking member, and iii) a third blocking member disposed on and further toward the outer portion of the non-emission area than the second blocking member, and
wherein the second blocking member has a height that is greater than the height of the first blocking member and less than the height of the third blocking member.

16. The OLED display of claim 15, wherein the encapsulation unit has a plurality of second thin films, and wherein the height of the first blocking member is substantially the same as or greater than the height of a thin film disposed at the lowermost end among second thin films.

17. The OLED display of claim 15, wherein the encapsulation unit has a plurality of second thin films, and wherein the height of the second blocking member is substantially the same as or greater than the height of a thin film disposed at the second lowermost end among the second thin films.

18. The OLED display of claim 15, wherein the encapsulation unit has more than three second thin films, and wherein the height of the third blocking member is substantially the same as or greater than the height of a thin film disposed at the third lowermost end among the second thin films.

19. The OLED display of claim 14, wherein the first blocking member, the second blocking member, and the third blocking member are separated from one another.

20. An organic light emitting diode (OLED) display comprising:
a substrate comprising a light emission area and a non-emission area surrounding the light emission area;
an organic light emitting unit formed on the light emission area;
a blocking unit disposed on the non-emission area to surround the organic light emitting unit;
a coating unit covering an external surface of the blocking unit; and
an encapsulation unit encapsulating the organic light emitting unit, wherein encapsulation unit comprises at least one first thin film and at least one second thin film alternatively stacked on each other on an area surrounded by the blocking unit,
wherein the blocking unit comprises i) a first blocking member disposed on the non-emission area to surround the organic light emitting unit, ii) a second blocking member disposed on and further toward an outer portion of the non-emission area than the first blocking member, and iii) a third blocking member disposed on and further toward the outer portion of the non-emission area than the second blocking member,
wherein the first blocking member, the second blocking member, and the third blocking member are separated from one another, and
wherein the encapsulation unit comprises a plurality of second thin films, and wherein a thin film disposed at the lowermost end among the second thin films is disposed between the organic light emitting unit and the first blocking member.

21. The OLED display of claim 19, wherein the encapsulation unit comprises a plurality of second thin films, and wherein a thin film disposed at the second lowermost end among the plurality of second thin films is disposed between the first blocking member and the second blocking member.

22. The OLED display of claim 19, wherein the encapsulation unit comprises more than three second thin films, and wherein a thin film disposed at the third lowermost end among the second thin films is disposed between the second blocking member and the third blocking member.

23. The OLED display of claim 1, further comprising:
a moisture absorbent covering upper portions of the encapsulation unit and the coating unit; and
a film covering the moisture absorbent.

* * * * *